United States Patent
Trampitsch et al.

(10) Patent No.: US 12,249,978 B2
(45) Date of Patent: Mar. 11, 2025

(54) ISOLATED BOOTSTRAPPED SWITCH CIRCUIT

(71) Applicant: Analog Devices International Unlimited Company, Limerick (IE)

(72) Inventors: Gerd Trampitsch, Munich (DE); Leon Alexander Loopik, ZH (NL)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/932,878

(22) Filed: Sep. 16, 2022

(65) Prior Publication Data

US 2024/0097670 A1  Mar. 21, 2024

(51) Int. Cl.
*H03K 17/082* (2006.01)
*H03K 19/003* (2006.01)

(52) U.S. Cl.
CPC ... *H03K 17/0822* (2013.01); *H03K 19/00315* (2013.01)

(58) Field of Classification Search
CPC ......... H03K 17/0822; H03K 17/08104; H03K 17/08122; H03K 17/162; H03K 2217/0018
See application file for complete search history.

(56) References Cited

U.S. PATENT DOCUMENTS

| | | | | |
|---|---|---|---|---|
| 5,526,253 | A * | 6/1996 | Duley | H02M 3/07 363/59 |
| 5,818,209 | A * | 10/1998 | Masini | H03F 3/2171 323/224 |
| 6,628,159 | B2 * | 9/2003 | Voldman | H01L 29/78615 257/E29.281 |
| 8,890,577 | B1 | 11/2014 | Trampitsch | |
| 8,907,703 | B1 | 12/2014 | Trampitsch | |
| 9,172,364 | B2 | 10/2015 | Trampitsch | |
| 11,012,062 | B2 * | 5/2021 | Shin | H03K 17/063 |

* cited by examiner

*Primary Examiner* — Menatoallah Youssef
*Assistant Examiner* — Colleen J O Toole
(74) *Attorney, Agent, or Firm* — Schwegman Lundberg & Woessner, P.A.

(57) ABSTRACT

A charge pump is connected between a source and a body of the switch. Such a configuration avoids a condition in which the body diode opens for negative drain-to-source voltage (Vds) across the switch. Such a configuration also avoids a condition in which the switch control circuit generates control signals referenced to a body potential rather than a source potential, thereby allowing the switch to reliably turn off even for negative Vds. An additional gain stage ensures that the switch can be properly turned on. The techniques can be used to generate switches that enable highly linear processing of bipolar differential signals even far outside of the supply range.

20 Claims, 5 Drawing Sheets

ISOLATED BOOTSTRAPPED SWITCH CIRCUIT

FIELD OF THE DISCLOSURE

This document pertains generally, but not by way of limitation, to the configuration and control of switch circuits. More specifically, this disclosure provides pertains to improved control of switch circuits to enhance switch performance metrics.

BACKGROUND

Switches can be used to provide or restrict an electrical path between terminals. Switches can be implemented using transistors in a variety of applications including digital electronics, logic gate circuits, and control of high-power devices such as motors. As an example, a single transistor can be used to generate a low impedance or a high impedance between the source and the drain of the transistor in response to an applied control signal. However, the control signals that are applied to the transistor can cause the switch to leak currents. For example, as the source of the transistor increases to a higher potential than the drain, a forward biased body diode, caused by the junction formed between the back gate and the drain, can allow current to flow from the source and the back gate terminal to the drain terminal, thereby degrading performance of the switch.

The current path caused by the body diode can be avoided by placing a second transistor back-to-back with the first transistor. In this arrangement, the sources of the transistors can be coupled together, and the gates of the transistors can be coupled together. The back-to-back transistor arrangement may block the current path caused by the body diode in both directions. However, even with this arrangement, the applied control signal can still change various parameters of the switch in a destructive manner.

SUMMARY OF THE DISCLOSURE

This disclosure describes, among other things, a charge pump connected between a source and a body of a switch. Such a configuration avoids a condition in which the body diode opens for negative drain-to-source voltage (Vds) across the switch. Such a configuration also avoids a condition in which the switch control circuit generates control signals referenced to a body potential rather than a source potential, thereby allowing the switch to reliably turn off even for negative Vds. An additional gain stage ensures that the switch can be properly turned on. The techniques of this disclosure can be used to generate switches that enable highly linear processing of bipolar differential signals even far outside of the supply range.

In some aspects, this disclosure is directed to a bootstrapped switch circuit coupled to a timing circuit that provides one or more signals, the bootstrapped switch circuit having an input terminal and an output terminal, the bootstrapped switch circuit comprising: a switch having a first terminal coupled to the input terminal, a second terminal coupled to the output terminal, and a control terminal, wherein the switch includes a diode coupled between a fourth terminal of the switch and the second terminal of the switch; a charge pump coupled to the timing circuit, wherein the charge pump generates a charge pump voltage, and wherein the charge pump voltage is coupled to the fourth terminal of the switch; a logic circuit coupled to the timing circuit; and a gain stage coupled between an output of the logic circuit and the control terminal of the switch, wherein the logic circuit is configured to provide a control signal to the control terminal of the switch.

In some aspects, this disclosure is directed to a circuit comprising: a first bootstrapped switch circuit coupled to a first timing circuit that provides one or more signals, the first bootstrapped switch circuit having an input terminal and an output terminal, the first bootstrapped switch circuit comprising: a first switch having a first terminal coupled to the input terminal of the first bootstrapped switch circuit, a second terminal coupled to the output terminal of the first bootstrapped switch circuit, and a control terminal, wherein the first switch includes a diode coupled between a fourth terminal of the first switch and the second terminal of the first switch; a first charge pump coupled to the first timing circuit, wherein the first charge pump generates a first charge pump voltage, and wherein the first charge pump voltage is coupled to the fourth terminal of the first switch; a first logic circuit coupled to the first timing circuit; and a first gain stage coupled between an output of the first logic circuit and the control terminal of the first switch, wherein the first logic circuit is configured to provide a first control signal to the control terminal of the first switch; and an analog-to-digital converter circuit having a first input coupled to a first capacitor, wherein the first capacitor is coupled to the output terminal of the first bootstrapped switch circuit.

In some aspects, this disclosure is directed to a circuit comprising: a first bootstrapped switch circuit coupled to a first timing circuit that provides one or more signals, the first bootstrapped switch circuit having an input terminal and an output terminal, the first bootstrapped switch circuit comprising: a first switch having a first terminal coupled to the input terminal of the first bootstrapped switch circuit, a second terminal coupled to the output terminal of the first bootstrapped switch circuit, and a control terminal, wherein the first switch includes a diode coupled between a fourth terminal of the first switch and the second terminal of the first switch; a first charge pump coupled to the first timing circuit, wherein the first charge pump generates a first charge pump voltage, and wherein the first charge pump voltage is coupled to the fourth terminal of the first switch; a first logic circuit coupled to the first timing circuit; and a first gain stage coupled between an output of the first logic circuit and the control terminal of the first switch, wherein the first logic circuit is configured to provide a first control signal to the control terminal of the first switch; and a second bootstrapped switch circuit coupled to a second timing circuit that provides one or more signals, the second bootstrapped switch circuit having an input terminal and an output terminal, the second bootstrapped switch circuit comprising: a second switch having a first terminal coupled to the input terminal of the second bootstrapped switch circuit, a second terminal coupled to the output terminal of the second bootstrapped switch circuit, and a control terminal, wherein the second switch includes a diode coupled between a fourth terminal of the second switch and the second terminal of the second switch; a second charge pump coupled to the second timing circuit, wherein the second charge pump generates a second charge pump voltage, and wherein the second charge pump voltage is coupled to the fourth terminal of the second switch; a second logic circuit coupled to the second timing circuit; and a second gain stage coupled between an output of the second logic circuit and the control terminal of the second switch, wherein the second logic circuit is configured to provide a second control signal to the control terminal of the second switch, and an analog-to-digital converter circuit having a first input coupled to a first capacitor, and a second input coupled to a second capacitor, wherein the first capacitor is coupled to the output terminal of the first bootstrapped switch circuit, and wherein the second capacitor is coupled to the output terminal of the second bootstrapped switch circuit.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In some approaches, isolated bootstrapped switch circuits use capacitor charge pumps and digital level shifters for controlling the state of the switch. A charge pump is connected to the source of the switch and a latch biased from the charge pump generates switch control signals between source and gate. The present inventors have recognized that a problem with such a configuration is that the switch cannot be turned off when the drain potential is below the source potential.

Using various techniques of this disclosure, a charge pump is connected between the source and the body of the switch. Such a configuration avoids a condition in which the body diode opens for negative drain-to-source voltage (Vds) across the switch. Such a configuration also avoids a condition in which the switch control circuit generates control signals referenced to a body potential rather than a source potential, thereby allowing the switch to reliably turn off even for negative Vds. An additional gain stage ensures that the switch can be properly turned on. The techniques of this disclosure can be used to generate switches that enable highly linear processing of bipolar differential signals even far outside of the supply range.

The charge pump capacitors are usually significantly larger than the level shift capacitors. The size of the charge pump capacitors determines the driving strength of the charge pump. For minimizing total capacitance area, the charge pumps can be clocked at a higher rate than the switch itself.

The isolated bootstrapped switches of this disclosure can be used in, for example, input stages of switched capacitor analog-to-digital converters (ADCs), continuous time ADCs, chopped low offset amplifiers, etc. The ability to sample bipolar input signals at several megahertz even in the presence of fast common mode variations makes such switches the perfect choice for ADC input stages of battery management ICs.

Figure 1:
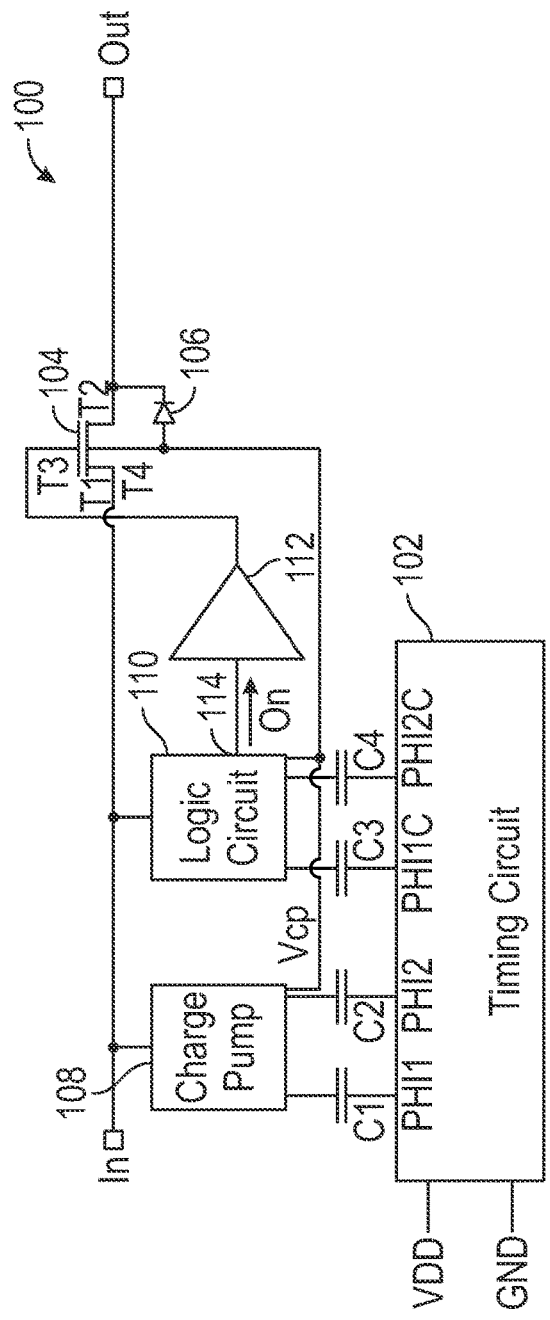
FIG. 1 is a block diagram of an example of a bootstrapped switch circuit that can implement various techniques of this disclosure.

FIG. 1 is a block diagram of an example of a bootstrapped switch circuit that can implement various techniques of this disclosure. The bootstrapped switch circuit 100 has an input terminal IN and an output terminal OUT and is coupled to a timing circuit 102 that provides one or more clock signals, such as the clock signals Phi1 and Phi2, and their complements Phi1C and Phi2C. The timing circuit 102 is configured to receive a supply voltage VDD.

The bootstrapped switch circuit 100 includes a switch 104, e.g., a field-effect transistor (FET), having a first terminal T1, e.g., a drain terminal, coupled to the input terminal IN, a second terminal T2, e.g., a source terminal, coupled to the output terminal OUT, and a control terminal T3, e.g., a gate terminal. The switch 104 includes a body diode 106 coupled between a fourth terminal T4, e.g., the body or substrate, of the switch 104 and the second terminal T2 of the switch 104.

The bootstrapped switch circuit 100 includes a charge pump 108 coupled to the timing circuit 102, such as using capacitors C1 and C2, and configured to receive the clock signals Phi1 and Phi2. The charge pump 108 generates a charge pump voltage Vcp and is coupled to the fourth terminal T4 of the switch 104.

The bootstrapped switch circuit 100 includes a logic circuit 110 coupled to the timing circuit 102, such as using capacitors C3 and C4, and is configured to receive the clock signals Phi1c and Phi2c. The bootstrapped switch circuit 100 includes a gain stage 112, e.g., a 2X gain stage, coupled between an output 114 of the logic circuit 110 and the control terminal T3 of the switch 104. In some examples, the gain stage includes an amplifier circuit. The logic circuit 110 is configured to provide a control signal ON to the control terminal T3 of the switch 104.

As seen in FIG. 1, the charge pump voltage Vcp is not connected to the source terminal T2 of the switch 104. Instead, the charge pump voltage Vcp is connected between the source terminal T2 and the body terminal T4. The charge pump voltage Vcp is below the source potential and, as such, the body diode 106 sees different voltages.

In other approaches, the body diode 106 is coupled to terminal T1 and if the voltage at the input terminal IN is greater than the voltage at the output terminal OUT, then the body diode 106 conducts and the switch 104 will not operate. However, using the techniques of this disclosure, and as shown in FIG. 1, the body diode 106 only conducts when the voltage at the output terminal OUT is less than the voltage at the body connection. The body diode 106 will not immediately conduct, such as when the voltage at the input terminal IN is greater than the voltage at the output terminal OUT.

The charge pump 108 generates a voltage rail that is below the voltage at the input terminal IN. In order to turn the switch 104 ON, a voltage at the control terminal T3 must be greater than the voltage at the input terminal IN. The gain stage 112 is used to ensure such a voltage is applied to the control terminal T3.

The charge pump 108 and the logic circuit 110 are controlled by the timing circuit 102. The timing circuit 102 applies the clock signals Phi1 and Phi2 to the charge pump 108 and applies complementary clock signal Phi1c and Phi2c to the logic circuit 110 to control the switch 104.

Figure 3:
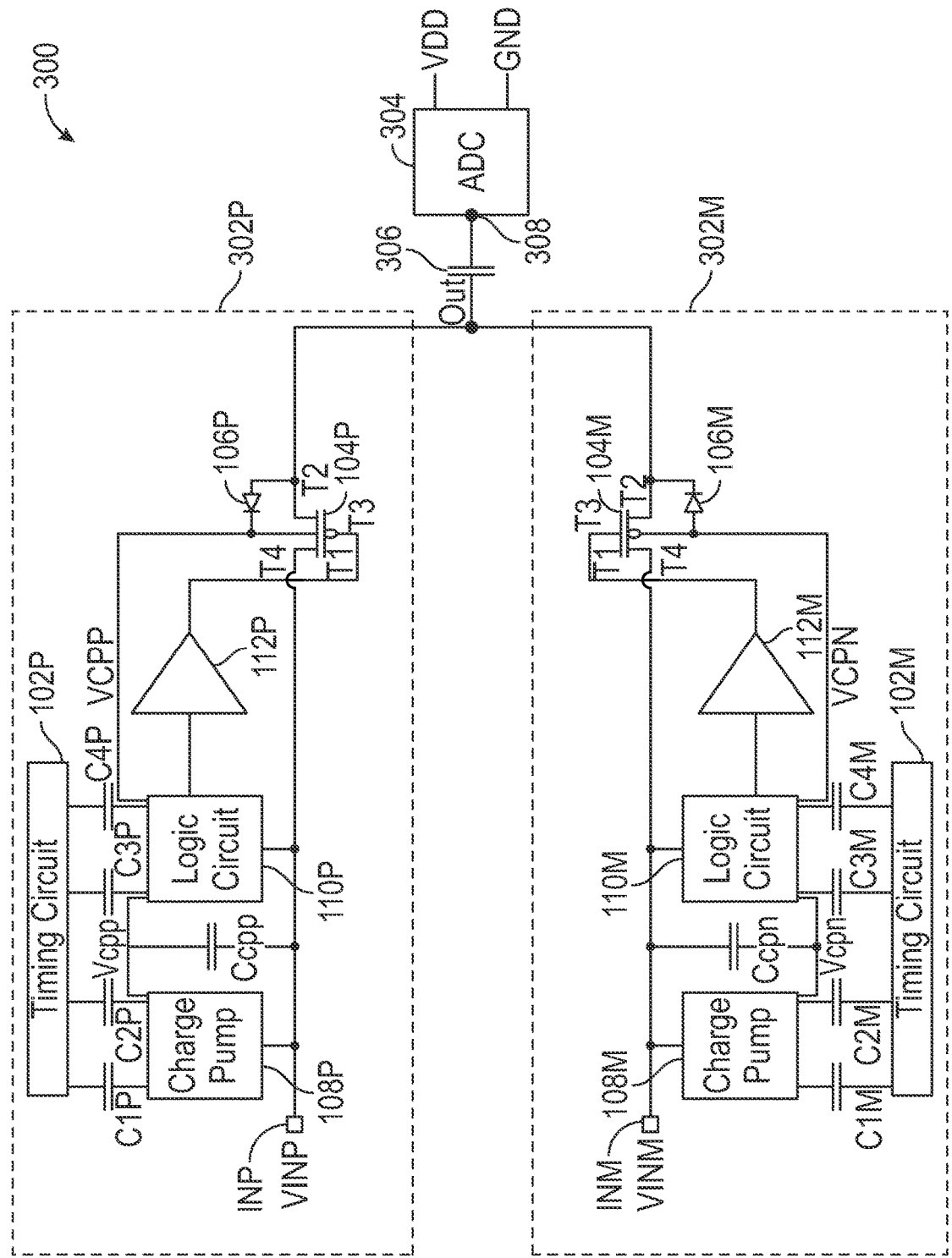
FIG. 3 is a block diagram of an example of a single-ended implementation of an ADC input stage using the bootstrapped switch circuit techniques of this disclosure.

The bootstrapped switch circuit 100 of FIG. 1 can be used as input stage of switched capacitor ADCs, continuous time ADCs, chopped low offset amplifiers, etc. For example, the output terminal OUT can be coupled to an ADC, such as shown in FIG. 3.

Figure 2:
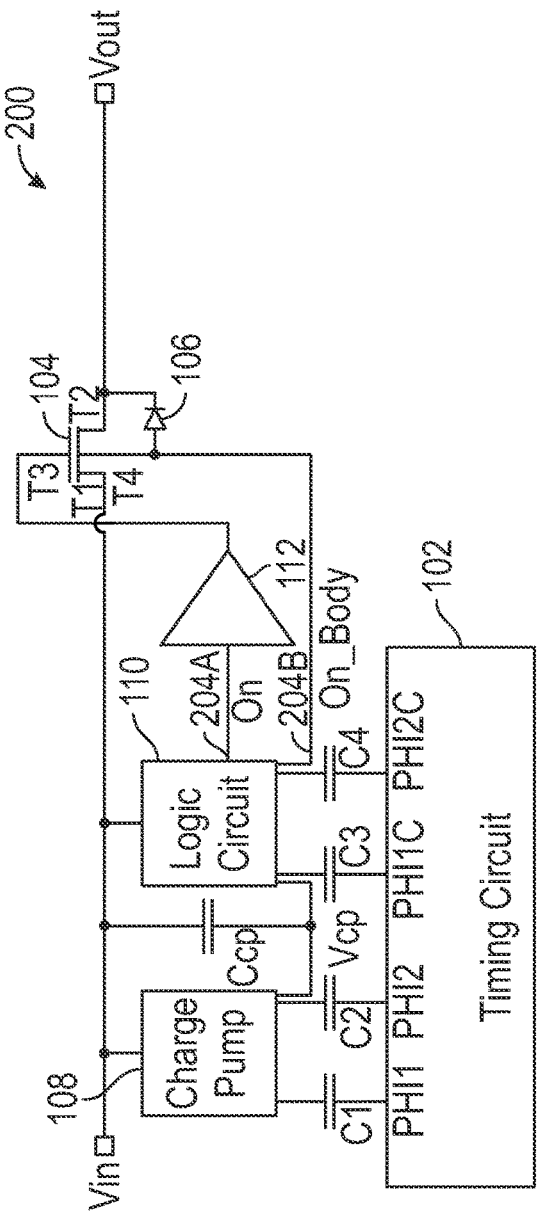
FIG. 2 is a block diagram of another example of a bootstrapped switch circuit 200 that can implement various techniques of this disclosure.

FIG. 2 is a block diagram of another example of a bootstrapped switch circuit 200 that can implement various techniques of this disclosure. Some of the components in FIG. 2 are similar to components in FIG. 1 and use similar reference numbers. For purposes of conciseness, similar components will not be described in detail again.

In FIG. 2, the logic circuit 110 is configured to receive the charge pump voltage Vcp and control the fourth terminal T4 of the switch 104. The charge pump 108 of the bootstrapped switch circuit 200 is configured to provide the charge pump voltage Vcp, developed across the charge pump capacitor Ccp, to the logic circuit 110. The logic circuit 110 includes a first output 204A configured to supply a first control signal ON to the control terminal T3 of the switch 104, e.g., gate terminal, via the gain stage 112. In the configuration in FIG. 2, the logic circuit 110 includes a second output 204B configured to supply a second control signal ON_body to the fourth terminal T4 of the switch 104, e.g., the body terminal. In some examples, the first control signal ON and the second control signal ON_body are supplied concurrently. The control signal ON_body can be supplied by the charge pump voltage Vcp or the input voltage VIN.

When the logic circuit 110 applies a voltage to the gate of the switch 104, the logic circuit 110 also applies a voltage to connect the body of the switch 104 to the source of the switch 104. This is in contrast to the configuration shown in FIG. 1 in which the charge pump 108 is directly coupled to the fourth terminal T4 and the voltages to the gate and body are not necessarily applied at the same time.

The larger the voltage between the source terminal and the body terminal, the lower the on resistance of the switch 104. By using the techniques of FIG. 2, the body voltage is controlled together with the gate voltage to minimize the impact of the body-effect on the switch 104 on resistance.

The bootstrapped switch circuit 200 of FIG. 2 can be used as an input stage of switched capacitor ADCs, continuous time ADCs, chopped low offset amplifiers, etc. For example, the output terminal OUT can be coupled to an ADC, such as shown in FIG. 3.

FIG. 3 is a block diagram of an example of a single-ended implementation of an ADC input stage using the bootstrapped switch circuit techniques of this disclosure. Some of the components in FIG. 3 are similar to components in FIG. 1 and use similar reference numbers. For purposes of conciseness, similar components will not be described in detail again.

The circuit 300 includes a first bootstrapped switch circuit 302P configured to receive a positive input voltage VINP at the positive input terminal INP, and a second bootstrapped switch circuit 302M configured to receive a negative input voltage VINM at the negative input terminal INM. Each of the first bootstrapped switch circuit 302P and the second bootstrapped switch circuit 302M can be similar to the bootstrapped switch circuit 200 of FIG. 2. In some examples, the switch 104P of the first bootstrapped switch circuit 302P can be a P-type FET and the switch 104M of the second bootstrapped switch circuit 302M can be an N-type FET.

The first bootstrapped switch circuit 302P is coupled to and controlled by a first timing circuit 102P and the second bootstrapped switch circuit 302M is coupled to and is controlled by a second timing circuit 102M. In some examples, the timing circuit 102P and the second timing circuit 102M are the same timing circuit. In other examples, the timing circuit 102 and the second timing circuit 102M are separate timing circuits.

In FIG. 3, the first logic circuit 110P is configured to receive the first charge pump voltage Vcpp and provide the first charge pump voltage Vcpp to the fourth terminal T4 of the first switch 104P. Similarly, the second logic circuit 110M is configured to receive the second charge pump voltage Vcpn and provide the second charge pump voltage Vcpn to the fourth terminal T4 of the second switch 104M.

In the single-ended implementation shown in FIG. 3, the circuit 300 operates by alternatingly connecting the first bootstrapped switch circuit 302P and the second bootstrapped switch circuit 302M to an ADC circuit 304, such as using an input capacitor 306 coupled to the output terminal OUT of the first bootstrapped switch circuit 302P and an input terminal 308 of the ADC circuit 304. The output terminal OUT represents the output terminals of each of the first bootstrapped switch circuit 302P and the second bootstrapped switch circuit 302M electrically coupled together. In the example shown, the first timing circuit 102P connects the input capacitor 306 first to the positive input voltage VINP by closing the switch 104P. Then, the first timing circuit 102P opens the switch 104P and then closes the switch 104M to connect the input capacitor 306 to the negative input voltage VINM. This process repeats.

Due to the charge pump 108P and the charge pump 108M, the body diode 106P and the body diode 106M, respectively, will not conductive if there is a negative input voltage. For example, if the negative input voltage VINM is greater than the positive input voltage VINP, the diodes will not conduct because the charge pumps provide additional room.

The configuration shown in FIG. 3 can sample negative differential voltages. The body diodes of the switch 104P and the switch 104M conduct when VINP-VINM <Vcp+ 0.6V.

Figure 4:
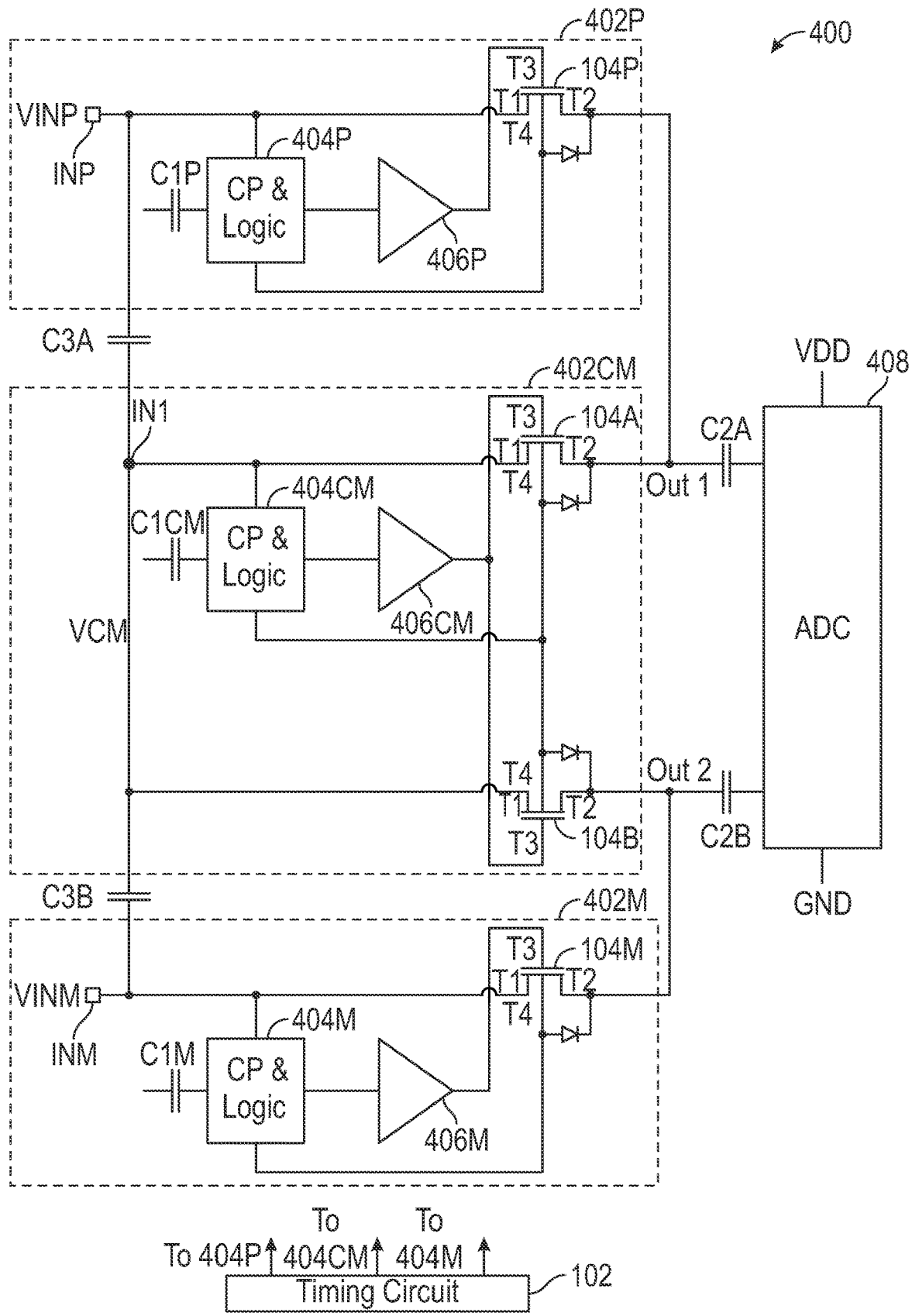
FIG. 4 is a block diagram of an example of a fully differential implementation of an ADC input stage using the bootstrapped switch circuit techniques of this disclosure.

FIG. 4 is a block diagram of an example of a fully differential techniques of this disclosure. Some of the components in FIG. 4 are similar to components in FIG. 1 and use similar reference numbers. For purposes of conciseness, similar components will not be described in detail again.

The circuit 400 includes a first bootstrapped switch circuit 402P configured to receive a positive input voltage VINP at the positive input terminal INP, and a second bootstrapped switch circuit 402M configured to receive a negative input voltage VINP at the negative input terminal INM. Each of the first bootstrapped switch circuit 402P and the second bootstrapped switch circuit 402M can be similar to the bootstrapped switch circuit 200 of FIG. 2. The switch 104P of the first bootstrapped switch circuit 402P, the switch 104M of the second bootstrapped switch circuit 402M, and the switches 104A, 104B of the third bootstrapped switch circuit 402CM can be N-type FETs, for example.

The first bootstrapped switch circuit 402P includes a charge pump and a logic circuit, shown as a combined charge pump and logic circuit 404P for conciseness, coupled to a gain stage 406P. Via the gain stage 406P, the logic circuit 404P supplies a control signal to the third terminal T3 of the switch 104P, e.g., the gate terminal. In some examples, the logic circuit 404P includes a second output configured to supply a second control signal to the fourth terminal T4 of the switch 104P, e.g., the body terminal, like in FIG. 2. In some examples, the first control signal and the second control signal are supplied concurrently.

The second bootstrapped switch circuit 402M includes a charge pump and a logic circuit, shown as a combined charge pump and logic circuit 404M for conciseness, coupled to a gain stage 406M. Via the gain stage 406M, the logic circuit 404M supplies a control signal to the third terminal T3 of the switch 104M, e.g., the gate terminal. In some examples, the logic circuit 404M includes a second output configured to supply a second control signal to the fourth terminal T4 of the switch 104M, e.g., the body terminal, like in FIG. 2. In some examples, the first control signal and the second control signal are supplied concurrently.

The third bootstrapped switch circuit 402CM includes an input terminal IN1. Unlike the first bootstrapped switch circuit 402P and the second bootstrapped switch circuit 402M, the third bootstrapped switch circuit 402CM includes two switches 104A, 104B that are each electrically coupled to the input terminal IN1. The third bootstrapped switch circuit 402CM includes a charge pump and a logic circuit, shown as a combined charge pump and logic circuit 404CM for conciseness, coupled to a gain stage 406CM. Via the gain stage 406CM, the logic circuit 404CM supplies a control signal to the third terminal T3 of the switch 104A, e.g., the gate terminal, and to the third terminal T3 of the switch 104B, e.g., the gate terminal. In some examples, the logic circuit 404CM includes a second output configured to supply a second control signal to the fourth terminal T4 of the switch 104A, e.g., the body terminal, like in FIG. 2, and to the fourth terminal T4 of the switch 104B, e.g., the body terminal. In some examples, the first control signal and the second control signal are supplied concurrently.

A first capacitor C3A is coupled between the positive input terminal INP of the first bootstrapped switch circuit 402P and the input terminal IN1 of the third bootstrapped switch circuit 402CM. A second capacitor C3B is coupled between the negative input terminal INM of the second bootstrapped switch circuit 402M and the input terminal IN1 of the third bootstrapped switch circuit 402CM. The input terminal IN1 of the third bootstrapped switch 402CM is configured to receive a common mode voltage VCM generated using the positive input voltage VINP and the negative input voltage VINM.

A timing circuit 102 is coupled to the charge pump and logic circuit 404P, the charge pump and logic circuit 404CM, and the charge pump and logic circuit 404M, such as via capacitors C1P, C1CM, and C1M.

The third bootstrapped switch circuit 402CM includes two output terminals. The output terminal OUT1 in FIG. 4 represents the output terminal of the first bootstrapped switch circuit 402P and a first one of the outputs of the third bootstrapped switch circuit 402CM tied together. The output terminal OUT2 in FIG. 4 represents the output terminal of the second bootstrapped switch circuit 402M and a second one of the outputs of the third bootstrapped switch circuit 402CM tied together.

In the fully differential implementation shown in FIG. 4, the circuit 400 operates by only sampling two times half the input signal vs. a common mode voltage. First, the timing circuit 102 can control the first bootstrapped switch circuit 402P to close the switch 104P and control the second bootstrapped switch circuit 402M to close the switch 104M. After opening switches 104P and 402M, the timing circuit 102 can control the third bootstrapped switch circuit 402CM to couple the voltage at OUT1 to node IN1 (the common mode voltage VCM) by closing the switch 104A and couple the voltage at OUT2 to node IN1 (the common mode voltage VCM) by closing the switch 104B. In this manner, the circuit 400 can sample half the signal onto capacitors C2A, C2B, which are coupled to the corresponding inputs of an ADC circuit 408.

The configuration shown in FIG. 4 permits negative voltages that are even larger than those permitted by the circuit 300 of FIG. 3. The circuit 400 can sample negative differential voltages and the body diodes conduct when VINP-VINM<2x(Vcp+0.6V).

In some examples, the switches 104P, 104M, 104A, and 104B are N-type FETs. In other examples, the switches 104P, 104M, 104A, and 104B are P-type FETs.

Figure 5:
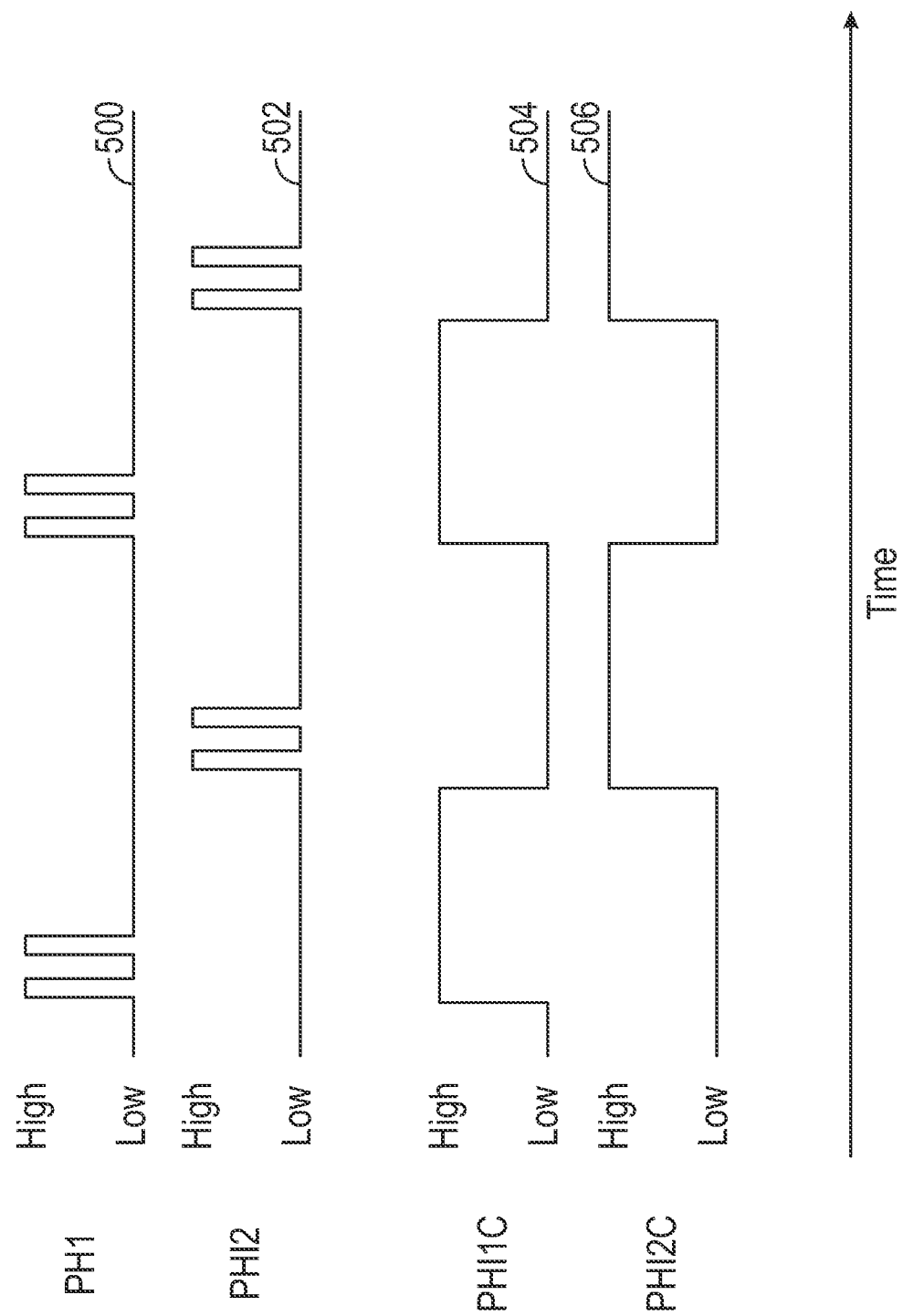
FIG. 5 is an example of a timing diagram of various clock signals generated by a timing circuit.

FIG. 5 is an example of a timing diagram of various clock signals generated by a timing circuit. Clock signals PHI1 and PHI2 are shown at 500 and 502, respectively. Clock signals PHI1 and PHI2 drive the charge pump, e.g., the charge pump 108 of FIG. 2. Clock signals PHI1$c$ and PHI2$c$ are shown at 504 and 506, respectively. Clock signals PHI1$c$ and PHI2$c$ are applied to the logic circuit, e.g., the logic circuit 110 of FIG. 2, which drives the switches. A charge pump can be stronger the faster it is clocked. As such, the clock signals PHI1 and PHI2 are clocked at a faster rate than the clock signals PHI1$c$ and PHI2$c$. In other words, the clock signals PHI1 and PHI2 have shorter pulse widths than those of the clock signals PHI1$c$ and PHI2$c$.

Figure 6:
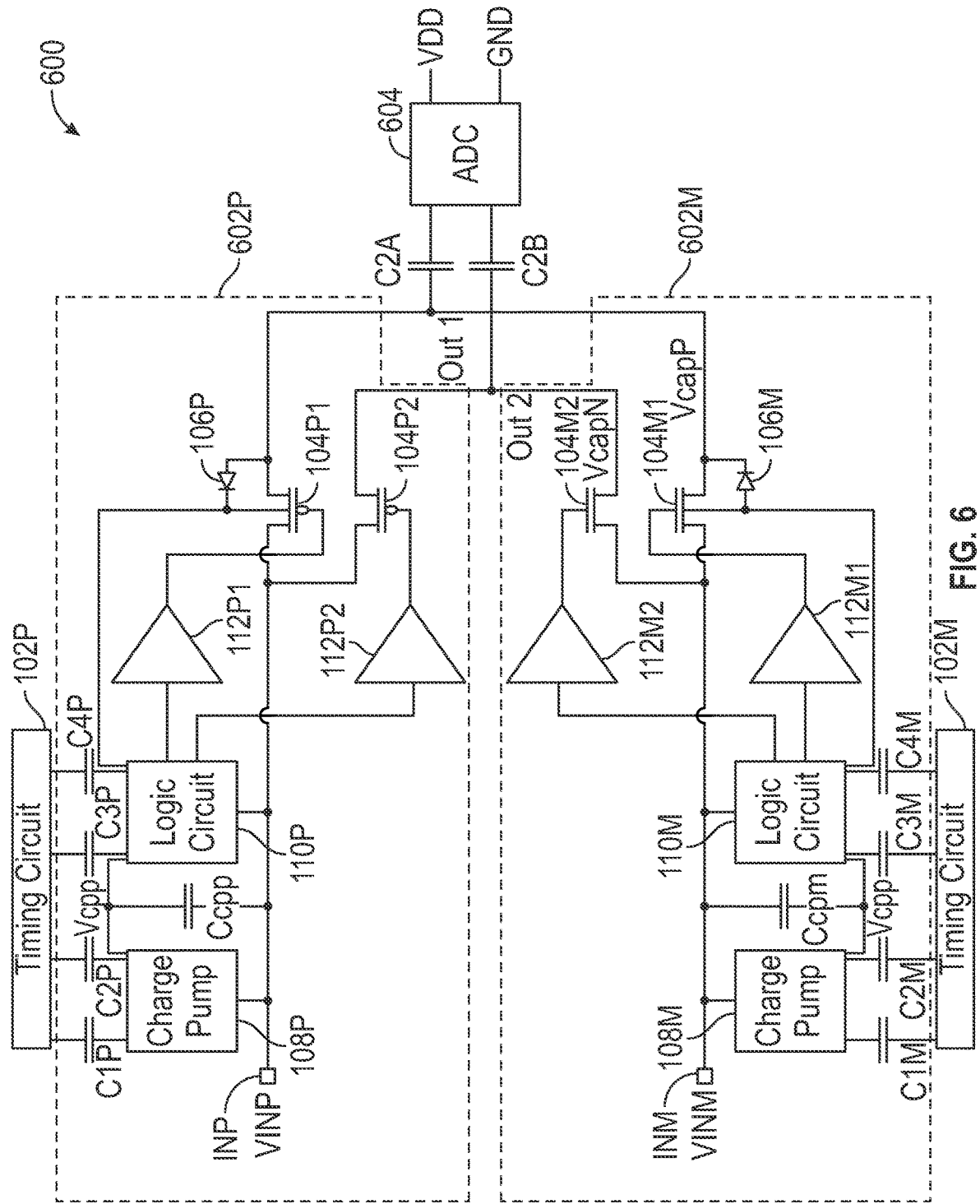
FIG. 6 is a block diagram of another example of a fully differential techniques of this disclosure.

FIG. 6 is a block diagram of another example of a fully differential techniques of this disclosure. Some of the components in FIG. 6 are similar to components in FIGS. 1-3 and use similar reference numbers. For purposes of conciseness, similar components will not be described in detail again.

The circuit 600 is a fully differential implementation of the circuit 300 of FIG. 3. The circuit 600 includes a first bootstrapped switch circuit 602P configured to receive a positive input voltage VINP at the positive input terminal INP, and a second bootstrapped switch circuit 602M configured to receive a negative input voltage VINP at the negative input terminal INM. The first bootstrapped switch circuit 602P includes two gain stages 112P1, 112P2 coupled to corresponding gate terminals of switches 104P1, 104P2, respectively. In the example shown, the switches 104P1, 104P2 are P-type FETs.

The second bootstrapped switch circuit 602M includes two gain stages 112M1, 112M2 coupled to corresponding gate terminals of switches 104M1, 104M2, respectively. In the example shown, the switches 104M1, 104M2 are N-type FETs.

The first bootstrapped switch circuit 602P includes two output terminals and the second bootstrapped switch circuit 602M includes two output terminals. The output terminal OUT1 in FIG. 6 represents a first output terminal of the first bootstrapped switch circuit 602P and a first output terminal of the second bootstrapped switch circuit 602M electrically coupled together. The output terminal OUT2 in FIG. 6 represents a second output terminal of the first bootstrapped switch circuit 602P and a second output terminal of the second bootstrapped switch circuit 602M electrically coupled together.

The circuit 600 can sample the differential input voltage between VINP and VINM onto capacitor C2A and C3B, which are coupled to the outputs OUT1 and OUT2 and corresponding inputs of an ADC circuit 604.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A bootstrapped switch circuit coupled to a timing circuit that provides one or more signals, the bootstrapped switch circuit having an input terminal and an output terminal, the bootstrapped switch circuit comprising:
    a switch having a first terminal coupled to the input terminal, a second terminal coupled to the output terminal, and a control terminal, wherein the switch includes a diode coupled between a fourth terminal of the switch and the second terminal of the switch;
    a charge pump coupled to the timing circuit, wherein a first terminal of the charge pump is coupled to the first terminal of the switch and a second terminal of the charge pump is coupled to the fourth terminal of the switch;
    a logic circuit coupled to the timing circuit; and
    a gain stage configured to operate in an isolated voltage domain, the gain stage coupled between an output of the logic circuit and the control terminal of the switch, wherein the gain stage has a gain greater than 1, and wherein, based on the output of the logic circuit, the gain stage is configured for providing negative to positive voltages between the first terminal of the switch and the control terminal of the switch.

2. The bootstrapped switch circuit of claim 1, wherein the logic circuit is configured to receive a charge pump voltage from the charge pump and control the fourth terminal of the switch.

3. The bootstrapped switch circuit of claim 2, wherein the logic circuit is configured to provide the control signal to the control terminal of the switch and provide another control signal to the fourth terminal of the switch concurrently.

4. The bootstrapped switch circuit of claim 1, wherein the charge pump is directly coupled to the fourth terminal of the switch.

5. The bootstrapped switch circuit of claim 1, wherein the output terminal is coupled to an analog-to-digital converter circuit.

6. A circuit comprising:
    a first bootstrapped switch circuit coupled to a first timing circuit that provides one or more signals, the first bootstrapped switch circuit having an input terminal and an output terminal, the first bootstrapped switch circuit comprising:
    a first switch having a first terminal coupled to the input terminal of the first bootstrapped switch circuit, a second terminal coupled to the output terminal of the first bootstrapped switch circuit, and a control terminal, wherein the first switch includes a diode coupled between a fourth terminal of the first switch and the second terminal of the first switch;
    a first charge pump coupled to the first timing circuit, wherein a first terminal of the first charge pump is coupled to the first terminal of the first switch and a second terminal of the first charge pump is coupled to the fourth terminal of the first switch;
    a first logic circuit coupled to the first timing circuit; and
    a first gain stage configured to operate in a first isolated voltage domain, the first gain stage coupled between an output of the first logic circuit and the control terminal of the first switch, wherein the first gain stage has a gain greater than 1, and wherein, based on the output of the first logic circuit, the first gain stage is configured for providing negative to positive first voltages between the first terminal of the first switch and the control terminal of the first switch, wherein the first logic circuit is configured to provide a first control signal to the control terminal of the first switch; and an analog-to-digital converter circuit having a first input coupled to a first capacitor, wherein the first capacitor is coupled to the output terminal of the first bootstrapped switch circuit.

7. The circuit of claim 6, comprising:

a second bootstrapped switch circuit coupled to a second timing circuit that provides one or more signals, the second bootstrapped switch circuit having an input terminal and an output terminal, the second bootstrapped switch circuit comprising:

a second switch having a first terminal coupled to the input terminal of the second bootstrapped switch circuit, a second terminal coupled to the output terminal of the second bootstrapped switch circuit, and a control terminal, wherein the second switch includes a diode coupled between a fourth terminal of the second switch and the second terminal of the second switch;

a second charge pump coupled to the second timing circuit, wherein a first terminal of the second charge pump is coupled to the first terminal of the second switch and a second terminal of the second charge pump is coupled to the fourth terminal of the second switch;

a second logic circuit coupled to the second timing circuit; and a second gain stage configured to operate in a second isolated voltage domain, the second gain stage coupled between an output of the second logic circuit and the control terminal of the second switch, and wherein, based on the output of the second logic circuit, the second gain stage is configured for providing negative to positive voltages between the first terminal of the second switch and the control terminal of the second switch, wherein the second logic circuit is configured to provide a second control signal to the control terminal of the second switch, and wherein the first capacitor is coupled to the output terminal of the second bootstrapped switch circuit.

8. The circuit of claim 7, wherein the first switch is an N-type field-effect transistor, and wherein the second switch is a P-type field-effect transistor.

9. The circuit of claim 7, wherein the input terminal of the first bootstrapped switch circuit is a negative input terminal, and wherein the input terminal of the second bootstrapped switch circuit is a positive input terminal.

10. The circuit of claim 7, wherein the first logic circuit is configured to receive a first charge pump voltage from the first charge pump and provide the first charge pump voltage to the fourth terminal of the first switch, and wherein the second logic circuit is configured to receive a second charge pump voltage from the second charge pump and provide the second charge pump voltage to the fourth terminal of the second switch.

11. The circuit of claim 6, comprising:

a second bootstrapped switch circuit coupled to a second timing circuit that provides one or more signals, the second bootstrapped switch circuit having an input terminal and an output terminal, the second bootstrapped switch circuit comprising:

a second switch having a first terminal coupled to the input terminal of the second bootstrapped switch circuit, a second terminal coupled to the output terminal of the second bootstrapped switch circuit, and a control terminal, wherein the second switch includes a diode coupled between a fourth terminal of the second switch and the second terminal of the second switch;

a second charge pump coupled to the second timing circuit, wherein the second charge pump is coupled to the fourth terminal of the second switch and to the first terminal of the second switch;

a second logic circuit coupled to the second timing circuit; and a second gain stage configured to operate in a second isolated voltage domain, the second gain stage coupled between an output of the second logic circuit and the control terminal of the second switch, wherein the second gain stage has a gain greater than 1, wherein the second gain stage is configured for providing negative to positive voltages between the first terminal of the second switch and the control terminal of the second switch, wherein the second logic circuit is configured to provide a second control signal to the control terminal of the second switch, and wherein the analog-to-digital converter circuit has a second input coupled to a second capacitor, wherein the second capacitor is coupled to the output terminal of the second bootstrapped switch circuit.

12. The circuit of claim 11, comprising:

a third bootstrapped switch circuit coupled to a third timing circuit that provides one or more signals, the third bootstrapped switch circuit having an input terminal and first and second output terminals, the third bootstrapped switch circuit comprising:

a third switch having a first terminal coupled to the input terminal of the third bootstrapped switch circuit, a second terminal coupled to the first output terminal of the third bootstrapped switch circuit, and a control terminal, wherein the third switch includes a diode coupled between a fourth terminal of the third switch and the second terminal of the third switch;

a fourth switch having a first terminal coupled to the input terminal of the third bootstrapped switch circuit, a second terminal coupled to the second output terminal of the third bootstrapped switch circuit, and a control terminal, wherein the fourth switch includes a diode coupled between a fourth terminal of the fourth switch and the second terminal of the fourth switch;

a third charge pump coupled to the third timing circuit, wherein the third charge pump is coupled to the fourth terminal of the third switch and to the fourth terminal of the fourth switch and to the first terminal of the third switch and to the first terminal of the fourth switch;

a third logic circuit coupled to the third timing circuit; and a third gain stage coupled between an output of the third logic circuit and the control terminal of the second switch, wherein the third gain stage has a gain greater than 1, wherein the third logic circuit is configured to provide a third control signal to the control terminal of the third switch and a fourth control signal to the control terminal of the fourth switch;

a first capacitor coupled between the input terminal of the first bootstrapped switch circuit and the input terminal of the third bootstrapped switch circuit; and a second capacitor coupled between the input terminal of the second bootstrapped switch circuit and the input terminal of the fourth bootstrapped switch circuit.

13. The circuit of claim 12, wherein the first switch is an N-type field-effect transistor, wherein the second switch is an N-type field-effect transistor, wherein the third switch is an N-type field-effect transistor, and wherein the fourth switch is an N-type field-effect transistor.

14. The circuit of claim 12, wherein the input terminal of the first bootstrapped switch circuit is a positive input terminal to receive a positive input voltage, wherein the input terminal of the second bootstrapped switch circuit is a negative input terminal to receive a negative input voltage, and wherein the input terminal of the third bootstrapped switch circuit is configured to receive a common mode voltage generated using the positive input voltage and the negative input voltage.

15. The circuit of claim 11, wherein the analog-to-digital converter circuit is configured in a fully differential configuration.

16. A circuit comprising:
a first bootstrapped switch circuit coupled to a first timing circuit that provides one or more signals, the first bootstrapped switch circuit having an input terminal and an output terminal, the first bootstrapped switch circuit comprising:
a first switch having a first terminal coupled to the input terminal of the first bootstrapped switch circuit, a second terminal coupled to the output terminal of the first bootstrapped switch circuit, and a control terminal, wherein the first switch includes a diode coupled between a fourth terminal of the first switch and the second terminal of the first switch;
a first charge pump coupled to the first timing circuit, wherein a first terminal of the first charge pump is coupled to the first terminal of the first switch and a second terminal of the first charge pump is coupled to the fourth terminal of the first switch;
a first logic circuit coupled to the first timing circuit; and
a first gain stage configured to operate in a first isolated voltage domain, the first gain stage coupled between an output of the first logic circuit and the control terminal of the first switch, wherein the first gain stage has a gain greater than 1, and wherein, based on the output of the first logic circuit, the first gain stage is configured for providing negative to positive first voltages between the first terminal of the first switch and the control terminal of the first switch,
wherein the first logic circuit is configured to provide a first control signal to the control terminal of the first switch; and
a second bootstrapped switch circuit coupled to a second timing circuit that provides one or more signals, the second bootstrapped switch circuit having an input terminal and an output terminal, the second bootstrapped switch circuit comprising:
a second switch having a first terminal coupled to the input terminal of the second bootstrapped switch circuit, a second terminal coupled to the output terminal of the second bootstrapped switch circuit, and a control terminal, wherein the second switch includes a diode coupled between a fourth terminal of the second switch and the second terminal of the second switch;
a second charge pump coupled to the second timing circuit, wherein a first terminal of the second charge pump is coupled to the first terminal of the second switch and a second terminal of the second charge pump is coupled to the fourth terminal of the second switch;
a second logic circuit coupled to the second timing circuit; and
a second gain stage configured to operate in a second isolated voltage domain, the second gain stage coupled between an output of the second logic circuit and the control terminal of the second switch, wherein the second gain stage has a gain greater than 1, and wherein, based on the output of the second logic circuit, the second gain stage is configured for providing negative to positive voltages between the first terminal of the second switch and the control terminal of the second switch,
wherein the second logic circuit is configured to provide a second control signal to the control terminal of the second switch, and
an analog-to-digital converter circuit having a first input coupled to a first capacitor, and a second input coupled to a second capacitor, wherein the first capacitor is coupled to the output terminal of the first bootstrapped switch circuit, and wherein the second capacitor is coupled to the output terminal of the second bootstrapped switch circuit.

17. The circuit of claim 16, wherein the first timing circuit and the second timing circuit are the same timing circuit.

18. The circuit of claim 17, wherein the output of the first logic circuit is a first output, and wherein the first bootstrapped switch circuit further includes:
a third switch;
a third gain stage coupled between a second output of the first logic circuit and a control terminal of the third switch, wherein the third gain stage has a gain greater than 1, and
wherein the output of the second logic circuit is a second output, and wherein the second bootstrapped switch circuit further includes:
a fourth switch;
a fourth gain stage coupled between a second output of the second logic circuit and a control terminal of the fourth switch, wherein the fourth gain stage has a gain greater than 1.

19. The circuit of claim 18, wherein the first switch and the third switch are P-type field-effect transistors, and wherein the second switch and the fourth switch are N-type field-effect transistors.

20. The circuit of claim 16, wherein the first timing circuit is configured to:
generate and apply first clock signals to the first charge pump; and
generate and apply second clock signals to the first logic circuit,
wherein the first clock signals have a short pulse width than the second clock signals.

* * * * *